United States Patent [19]
Yamagata et al.

[11] Patent Number: 4,751,167
[45] Date of Patent: Jun. 14, 1988

[54] IMAGE PRODUCING MATERIAL

[75] Inventors: Toshio Yamagata, Urawa; Kentaro Ohsawa, Yono, both of Japan

[73] Assignee: Kimoto & Co., Ltd., Tokyo, Japan

[21] Appl. No.: 43,188

[22] Filed: Apr. 27, 1987

[51] Int. Cl.$^4$ .............................................. G03C 1/90
[52] U.S. Cl. .................................. 430/263; 430/256; 430/275; 430/281; 430/273
[58] Field of Search ............... 430/262, 275, 281, 256, 430/273

[56] References Cited

U.S. PATENT DOCUMENTS

| | | | |
|---|---|---|---|
| 4,292,395 | 9/1981 | Wada et al. | 430/275 |
| 4,419,438 | 12/1983 | Etoh et al. | 430/275 |
| 4,447,519 | 5/1984 | Pritikin et al. | 430/275 |
| 4,524,126 | 6/1985 | Marinace et al. | 430/275 |

Primary Examiner—Jack P. Brammer
Attorney, Agent, or Firm—Frishauf, Holtz, Goodman & Woodward

[57] ABSTRACT

An image producing material which consists essentially of a substrate, an image producing layer and a photosensitive layer in that order. Before the material is exposed to light, the adhesion between the image producing layer and the photosensitive layer is lower than that between the substrate and the image producing layer, whereas, upon exposure to light, the adhesion between the image producing layer and the photosensitive layer becomes higher than that between the substrate and the image producing layer, so that, after exposure, when the photosensitive layer is peeled off, the image producing layer in the exposed area is removed with the photosensitive layer, and the image producing layer in the unexposed area is left on the substrate. Thus, the image producing material enables an image to be produced simply by peeling off the photosensitive layer without the need to apply a special surface treatment to the image producing layer and without the need for any heat treatment or the like after exposure.

19 Claims, 1 Drawing Sheet

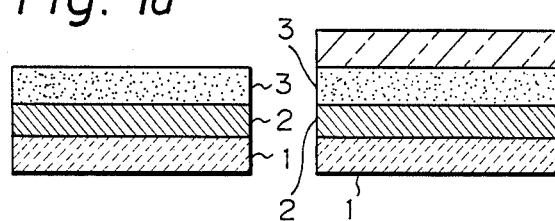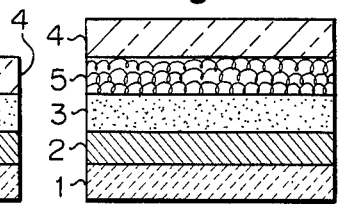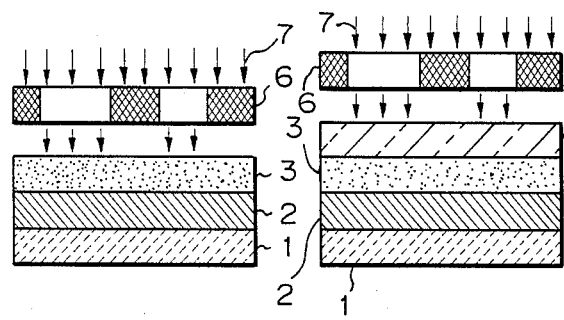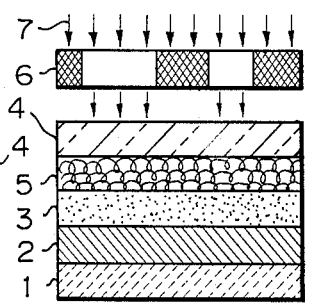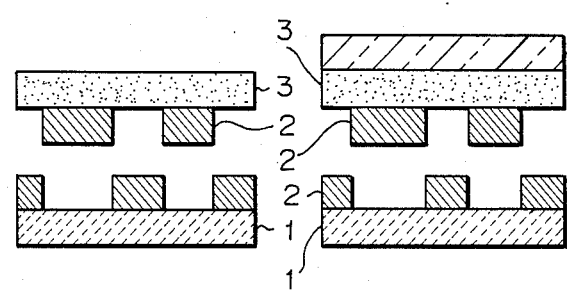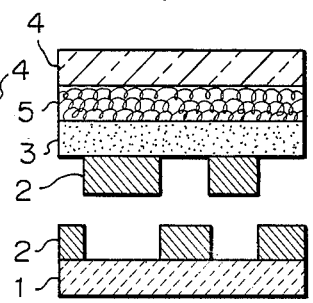

IMAGE PRODUCING MATERIAL

BACKGROUND OF THE INVENTION

1. Field of the Invention

The present invention relates to an image producing material. More particularly, the present invention pertains to a material for producing by means of peeling an image made from a thin layer of metal, a metal compound or a mixture of a metal and a metal compound.

Metal patterns which may be produced according to the present invention have a wide variety of applications such as intermediate or secondary originals, lithographic plates, process films, printed circuits, original copies for display and projection, electrodes for electroluminescence, label tapes, electrodes for liquid crystal display and plasma display, an ELD (Electroluminescent Display), anti-fogging and antifrost means for window glass, charge leak layers for electrophotography, antistatic layers, electrodes for photoelectric transducers, etc.

A methods of etching a metal using a photoresist have heretofore been known. In such methods, a photosensitive layer is formed on a material having a metal layer on a substrate by means of coating or laminating, and after this photosensitive layer has been exposed to light through a photoresist applied in a pattern corresponding to a desired image, development is carried out using a developer to produce a relief image of the photoresist. With this photoresist image as a mask, the metal layer is etched using an etching liquid such as an acid to produce a metal pattern. Further, the photoresist layer on the metal pattern may be removed according to need, using for example, a film removing liquid and thus completing the process. Accordingly, the conventional technique adopting the above-described method suffers from certain disadvantages in that it involves dangers in the etching operation, in that there is an indispensable need to arrange for disposal of drainage, and in that the etching speed depends on the kind of metal employed, i.e., certain kinds of metal are etched at an unfavorably slow rate.

Materials or methods for producing an image made from a metal or a metal compound on a substrate that make use of a peeling phenomenon have also been previously known.

2. Prior Art

Japanese Patent Publication No. 13305/1981 and Japanese Patent Public Disclosure No. 123130/1978 disclose a metal image producing material of the negative-positive type in which a thin layer of a metal or a metal compound and a photosensitive layer are provided on a substrate, the photosensitive layer containing a polymer binding compound and a quinone compound, diazonium compound, azido compound or benzophenone compound photosensitizer, and an image made from the thin metal or metal compound layer being produced by peeling off the photosensitive layer. These publications also describe a method of processing such a material. In this prior art, the material is subjected to moistening using warm water after exposure and before the peeling off of the photosensitive layer.

Japanese Patent Public Disclosure No. 130120/1979 discloses a photosensitive material consisting essentially of an image producing layer made of a metal or a metal compound, an intermediate layer made of a film forming thermoplastic polymeric material, and a photosensitive layer composed of a nitrogen-containing photolytic compound and a photosensitive composition containing a thermoplastic polymeric binding material which is a film forming material, these layers being successively provided on a substrate, wherein the interfacial adhesion between the image producing layer and the substrate or that between the image producing layer and the intermediate layer is decreased by irradiating the photosensitive layer with activation light and then heating this activated layer, and also discloses a method of using the above-described photosensitive image producing material which comprises heating the material and then peeling it off so that the image producing layer in the unexposed area or the exposed area is left on the substrate to define a pattern. This material requires a heat treatment after exposure and before peeling off of the photosensitive layer.

Japanese Patent Public Disclosure No. 198445/1984 discloses a metal image producing material of the positive-negative type in which a metal layer, a surface-treated metal layer and a photosensitive layer are provided on a substrate in that order and an image made from the metal layer is produced by peeling off the photosensitive layer. This material enables an image of a metal to be obtained simply by peeling off the photosensitive layer after exposure, but involves the need to subject the metal to a special surface treatment.

The present inventors made exhaustive studies in order to overcome the above-described problems and has thereby accomplished the present invention.

SUMMARY OF THE INVENTION

It is a primary object of the present invention to provide an image producing material which enables an image to be produced simply by peeling off the photosensitive layer without the need to apply a special surface treatment to the image producing layer and without the need for any heat treatment or the like after exposure.

To this end, the present invention provides an image producing material which includes a substrate, an image producing layer and a photosensitive layer which is capable of increasing the adhesion to the image producing layer upon exposure to light, the latter two layers being provided on the former layer in that order.

When the image producing material is exposed to light in a pattern that corresponds to a desired image, the adhesion between the photosensitive layer and the image producing layer in the exposed area increases, whereas there is no change in the adhesion between the photosensitive layer and the image producing layer in the unexposed area. Accordingly, when, in this state, the photosensitive layer is peeled off, the image producing layer in the exposed area is removed from the substrate, while the image producing layer in the unexposed area is left on the substrate to define the desired image.

From the viewpoint of the image producing mechanism according to the present invention, the relationship between the substrate, the image producing layer and the photosensitive layer must satisfy the following conditions. Namely, the adhesion between the photosensitive layer and the image producing layer before the exposure to light is lower than that between the image producing layer and the substrate, whereas the adhesion between the photosensitive layer and the image producing layer after exposure is higher than that between the image producing layer and the substrate.

BRIEF DESCRIPTION OF THE DRAWINGS

FIGS. 1a, 1b, and 1c are sectional views respectively showing image producing materials according to the present invention;

FIGS. 2a, 2b and 2c are sectional views of the image producing materials according to the present invention, which show the materials being exposed to activation light through respective originals; and FIGS. 3a, 3b and 3c show the image producing materials according to the present invention in a state wherein each of the photosensitive layers is peeled off after exposure to light to produce a desired pattern.

DETAILED DESCRIPTION OF THE INVENTION

The image producing material according to the present invention will be described hereinunder in more detail.

As illustrated in the accompanying drawings, an image producing material a according to the present invention consists essentially of a substrate 1, an image producing layer 2 and a photosensitive layer 3, while an image producing material b consists essentially of a substrate 1, an image producing layer 2 a photosensitive layer 3 and a cover film 4, and an image producing material c consists essentially of a substrate 1, an image producing layer 2, a photosensitive layer 3, an adhesive layer 5 and a cover film 4. Each of the image producing materials a to c is exposed to activation light 7 through an original 6.

The substrate which may be employed according to the present invention includes a variety of materials capable of accepting one or more layers thereon which are made from materials selected from among a metal, a metal compound and a mixture of a metal and a metal compound. In general, polymer compounds, glass, ceramics, metals, etc. may be employed. Examples of suitable polymer compounds are various synthetic resins, for example, a polyester such as polyethylene terephthalate, a polyamide, a polycarbonate, a polyolefin such as polypropylene, polyvinyl chloride, polystyrene, polymethyl methacrylate and a copolymer thereof and cellulose derivatives, for example, diacetylcellulose, triacetylcellulose, propylcellulose and a mixed cellulose ester.

Various additives such as pigment, dyestuff and filler may be incorporated in the substrate material to give a writing property, opacity and coloration. The substrate material may also be subjected to a surface treatment such as corona discharge treatment, sandblasting, chemical etching and coating with a polymer compound.

The substrate is generally formed in the shape of a film or sheet and may also be formed in the shape of a three-dimensional structure.

The image producing layer which is provided on the substrate consists of one or more layers of materials selected from among a metal, a metal compound and a mixture of a metal and a metal compound. Examples of the metal which may be employed according to the present invention are aluminum, zinc, copper, silver, gold, nickel, chromium, cobalt, titanium, iron, lead, tin, bismuth, platinum, a copper-zinc alloy, a nickel-chromium alloy and a nickel-iron alloy. Examples of the metal compound include tin oxide ($SnO_2$), indium oxide ($In_2O_3$), titanium dioxide, zinc oxide (ZnO), copper iodide (CuI), an oxide of indium-tin (ITO), cadmium sulfide, magnesium fluoride and $Cd_2SnO_4$.

The image producing layer may be provided on the substrate by, for example, vacuum evaporation, sputtering, ion plating or electroless plating.

The thickness of the image producing layer generally ranges from 10 m$\mu$ to 1000 m$\mu$ and may be selected so as to be appropriate for a particular use. When, for example, a metal layer of aluminum, tin or copper is used as a secondary original or an original copy for projection, if the image producing layer is excessively thin, the light barrier effect is insufficient, so that it is difficult to clearly discern the pattern produced on the substrate. When aluminum, copper, ITO or indium oxide is used as a thin electrically conductive film, an excessively thin image producing layer results in the surface resistance becoming excessively high, so that the produced film will be unsuitable for practical use. In any application, an excessively thick image producing layer will fail to obtain a sharp image and will lower the resolving power. For the above-described reasons, the thickness of the image producing layer is preferably selected to fall in a range from 20 m$\mu$ to 500 m$\mu$.

The photosensitive layer contains the following (A), (B) and (C) as essential components.

(A) One or more polymer compound selected from among a cellulose ester, a polyamide, a polyester, a polyurethane, a phenoxy resin, a polyvinyl acetal, polyvinyl chloride, a copolymer containing a vinyl chloride component as a constituent element, polyvinyl acetate, a copolymer containing a vinyl acetate component as a constituent element, polyvinylidene chloride, a copolymer containing a vinylidene chloride component as a constituent element, a polyacrylic ester, a copolymer containing an acrylic ester component as a constituent element, and polyvinyl alcohol.

(B) One or more compound of the formula:

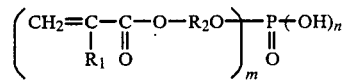

(wherein $R_1$ is hydrogen or a methyl group; $R_2$ is an alkylene group; either one of m and n is 1 or 2 and the other is 2 or 1, i.e., m+n=3).

(C) A photopolymerization initiator.

Examples of the cellulose ester as a polymer compound which is used to form the photosensitive layer are acetylbutyrylcellulose, nitrocellulose, ethylcellulose and acetylcellulose. Examples of the polyamide are Ultramide IC (a trade name of a copolymer of caprolactam, hexamethylenediamine adipate and 4,4'-diaminodicyclohexylmethane adipate) and polyamides obtained by methoxy-methylating hexamethylenediammonium adipate, hexamethylenediammonium sebacate or the like. Examples of the polyester are Bylon-200 and Bylon-300 which are manufactured by Toyo Spinning Co., Ltd. and Bital PE-200 and Bital PE-207 which are manufactured by Goodyear Co., Ltd. Examples of the polyurethane are Sanprene LQ-367, LQ-X5, LQ-909L, LQ-3510 and LOA-A which are manufactured by Sanyo Chemical Industries Co., Ltd. Examples of the polyvinyl acetal are polyvinyl butyral and polyvinyl formal. Examples of the copolymer containing a vinyl chloride component, the copolymer containing vinyl acetate component, the copolymer containing a vinylidene chloride component and the copolymer containing an acrylic ester component are polyvinyl chloride, vinyl chloride-vinyl acetate copolymer, vinyl chloride-vinylidene chloride copolymer, vinyl chloride-vinyl acetate-maleic anhydride copolymer, vinyl chloride-vinyl acetate-acrylonitrile copolymer, vinyl chloride-vinyl acetate-vinyl alcohol copolymer, vinyl chloride-vinylidene chloride-acrylonitrile copolymer, vinyl chloride-vinylidene chloride-methyl methacrylate copolymer, vinyl acetate, vinyl acetate-acrylic ester copolymer, ethylene-vinyl acetate copolymer, polyacrylic ester, acrylic ester-methyl methacrylate copolymer, and acrylic ester-styrene copolymer.

The following compounds are examples of the compounds of the formula:

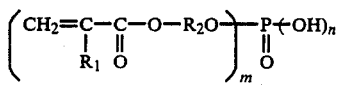

(wherein $R_1$ is hydrogen or a methyl group; $R_2$ is an alkylene group; either one of m and n is 1 or 2 and the other is 2 or 1, i.e., m+n=3).

Namely, acryloxyethyl phosphate, methacryloxyethyl phosphate, bis(acryloxyethyl) phosphate, bis(methacryloxyethyl) phosphate, acryloxypropyl phosphate, methacryloxypropyl phosphate, bis(acryloxypropyl) phosphate and bis(methacryloxypropyl) phosphate.

Examples of the photopolymerization initiator which is used to form the photosensitive layer are benzoin, benzoin methyl ether, benzoin ethyl ether, benzoin propyl ether, benzophenone, Michler's ketone, 4,4'-bis(diethylamino) benzophenone, 2-methylanthraquinone, 2-ethylanthraquinone, 1-hydroxycyclohexylphenyl ketone, benzyl methyl ketal, 2-chlorothioxanthone, 2,4-dimethyl thioxanthone, 2,4-diethyl thioxanthone, 2(O-chlorophenyl)-4,5-diphenylimidazole dimer, α,α-dichloro-4-phenoxyacetophenone, and α,α,α-tribromomethylphenylsulfone. These compounds may be employed alone or in combination in the form of a mixture of two or more of them.

Examples of ethylene unsaturated compounds other than those of the formula (B) which may be contained in the photosensitive layer include a variety of compounds such as acrylates, methacrylates and acrylamides. Among these compounds, those which are in the liquid or solid state at normal temperatures and whose boiling temperatures are 100° C or higher under normal pressures are particularly preferable.

Examples of the acrylates are n-butyl acrylate, cyclohexyl acrylate, 2-hydroxyethyl acrylate, 2-butoxyethyl acrylate, 2-phenoxyethyl acrylate, ethylene glycol diacrylate, diethylene glycol diacrylate, 1,6-hexanediol diacrylate, neopentyl glycol diacrylate, sorbitol diacrylate, sorbitol triacrylate, trimethylolethane triacrylate, trimethylolpropane triacrylate, pentaerythritol triacrylate, pentaerythritol tetraacrylate, depentaerythritol hexaacrylate, and dipentaerythritol pentaacrylate.

Examples of the methacrylates are n-butyl methacrylate, isobutyl methacrylate, cyclohexyl methacrylate, phenyl methacrylate, 2-hydroxyethyl methacrylate, ethylene glycol dimethacrylate, diethylene glycol dimethacrylate, 1,3-butylene glycol dimethacrylate, 1,4-butylene glycol dimethacrylate, dipropylene glycol dimethacrylate, neopentyl glycol dimethacrylate, 1,6-hexanediol dimethacrylate, bisphenol A dimethacrylate, sorbitol dimethacrylate, sorbitol trimethacrylate, trimethylolethane trimethacrylate, trimethylolpropane trimethacrylate, pentaerythritol trimethacrylate, and pentaerythritol tetramethacrylate.

Examples of the acrylamides are acrylamide, diacetone acrylamide, N,N-diethyl acrylamide, N,N'-methylene bisacrylamide, and N-hydroxymethyl acrylamide.

Examples of polymerizable ethylene unsaturated compounds other than those mentioned above are methacrylamide, N,N'-methylene bismethacrylamide, α-methylstyrene, allylacetic acid, allylacetone, allylalcohol, allylbenzene, 2-vinylpyridine, N-vinyl-2-pyrrolidone, itaconic acid diethyl, itaconic acid diaryl, itaconic acid monobutyl, maleic acid diaryl, fumaric acid diaryl, and N-lauryl maleimide.

A polymer compound other than those mentioned in (A) may also be added as a component of the photosensitive layer. Examples of such a polymer compound are chlorinated rubber, cyclized rubber, chlorinated polyethylene, chlorinated polypropylene, polyvinyl pyrrolidone, polycarbonate, polystyrene, styrene-maleic acid copolymer, vinyl methyl ethermaleic acid copolymer, and a ketone resin.

It is also possible to appropriately add a thermal polymerization inhibitor such as hydroquinone, hydroquinone monomethyl ether, P-benzoquinone or P-nitrophenol, a photopolymerization accelerator such as triethanolamine, P-dimethylamino methyl benzoate or P-dimethylamino isoamyl benzoate, dyestuff and pigment.

The amount of the compound shown in (B) which is added to the polymer compound in the photosensitive layer is generally from 0.5 to 10% by weight, and the amount of the photopolymerization initiator which is added to the polymer compound is generally from 0.1 to 20% by weight. In the case of employing an ethylene unsaturated compound other than those of the formula shown in (B), the amount of such compound which is used with respect to the polymer compound is generally 100% or less by weight.

The photosensitive layer is generally formed on the image producing layer by dissolving or dispersing in an appropriate solvent the components respectively shown in (A), (B) and (C), together with a thermal polymerization inhibitor, a photopolymerization accelerator, dyestuff and pigment, if desired, to prepare a photosensitive solution, directly applying this photosensitive solution to the image producing layer and drying the applied solution, or applying the prepared photosensitive solution to another substrate, drying the applied solution to form a photosensitive layer, and then laminating this photosensitive layer on the image producing layer.

Examples of the solvent which may be employed in the present invention include methyl ethyl ketone, acetone, toluene, xylene, cyclohexanone, methyl alcohol, ethyl alcohol, isopropyl alcohol, methyl Cellosolve, ethyl Cellosolve and ethyl acetate.

The thickness of the photosensitive layer is generally from 0.5 to 100μ and preferably from 2 to 20μ.

If desired, the image producing material according to the present invention may be provided with a cover film directly on the photosensitive layer in order to increase the mechanical strength of the photosensitive layer when peeled off and prevent the sensitivity from being lowered by the effect of oxygen in the air at the time of exposure to light. Thus, it is preferable to use a transparent material such as a film made of a polyester, polypropylene, a polyamide, polyvinyl chloride or a cellulose ester so that the cover film does not impair the photosensitivity of the photosensitive layer. In the case where the cover film is provided through an adhesive layer, it is possible to use a variety of adhesives, for example, an acrylic pressure-sensitive adhesive, an epoxy or urethane curing adhesive and a hot-melt adhesive such as ethylene-vinyl acetate copolymer.

When the image producing material arranged as detailed above is exposed to light through a desired pattern, the adhesion between the photosensitive layer and the image producing layer in the exposed area increases. When, in this state, the photosensitive layer is peeled off, the image producing layer corresponding to the exposed area is removed from the substrate, together with the photosensitive layer, and an image is defined by the image producing layer corresponding to the unexposed area which is left on the substrate.

As the light source, one emitting ultraviolet to visible light of short wave length, including solar rays, is preferably employed, for example, a high pressure mercury arc lamp, a carbon arc lamp, a xenon arc lamp or a metal halide arc lamp.

The present invention will be described hereinunder in more detail by way of Examples. However, it should be understood that the present invention is in no way limited to those examples.

EXAMPLE 1

On one side of a 100μ transparent polyethylene terephthalate film (substrate) a 100 mμ aluminum film was deposited by vacuum evaporation, and a photosensitive solution having the following chemical composition was applied to the surface of this aluminum film and dried at 90° C. for 2 minutes to obtain a photosensitive film having a thickness of 10μ.

| Photosensitive solution: | |
| --- | --- |
| Vinyl chloride-vinyl acetate-maleic anhydride copolymer 400 × 110A (available from Japanese Geon Co., Ltd.) | 20 parts by weight |
| bis(methacryloxyethyl) phosphate | 1 parts by weight |
| benzoin methyl ether | 2 parts by weight |
| methyl ethyl ketone | 60 parts by weight |
| toluene | 60 parts by weight |

A positive original was overlaid on the photosensitive layer of this photosensitive film and the assembly was exposed to light using an electrographic machine of Ricopy SM-1500 (available from Ricoh Co., Ltd., Tokyo, Japan) provided with a 1500 W mercury arc lamp at a printing exposure figure of 0. After the photosensitive layer had been peeled off, a sharp positive aluminum pattern remained on the substrate.

EXAMPLE 2

A photosensitive solution having the following chemical composition was applied to the surface of the aluminum-evaporated polyethylene terephthalate film used in

EXAMPLE 2

A photosensitive solution having the following chemical composition was applied to the surface of the aluminum-evaporated polyethylene terephthalate film used in Example 1 and dried at 90° C. for 2 minutes to obtain a photosensitive film having a thickness of 8μ.

| Photosensitive solution: | |
| --- | --- |
| polyvinyl butyral (available from UCC) | 10 parts by weight |
| acryloxyethyl phosphate | 0.5 parts by weight |

| -continued | |
| --- | --- |
| Photosensitive solution: | |
| dipentaerythritol hexacrylate | 4 parts by weight |
| 2-chlorothioxanthone | 0.5 parts by weight |
| P—dimethylamino methyl benzoate | 0.5 parts by weight |
| meta-denatured alcohol | 70 parts by weight |
| toluene | 20 parts by weight |

A positive original was overlaid on the photosensitive layer of this photosensitive film and the assembly was exposed to light with a 2 kW ultrahigh-pressure mercury arc lamp at a distance of 1 m for 40 seconds. After the photosensitive layer had been peeled off, a sharp positive aluminum pattern remained on the substrate.

EXAMPLE 3

A 70 mμ silver film was deposited on one side of a 100μ transparent polyethylene terephthalate film by vacuum evaporation, and the photosensitive solution used in Example 1 was similarly applied to the surface of this silver film and dried to obtain a photosensitive film.

This photosensitive film was exposed in the same way as in Example 1. After the photosensitive layer had been peeled off, a sharp positive silver pattern remained on the substrate.

EXAMPLE 4

A photosensitive solution having the following chemical composition was applied to the surface of the aluminum-evaporated polyethylene terephthalate film used in Example 1 and dried at 90° C. for 2 minutes to obtain a photosensitive film having a thickness of 12μ.

| Photosensitive solution: | |
| --- | --- |
| phenoxy resin (available from UCC under the name of "PKHH") | 20 parts by weight |
| methacryloxyethyl phosphate | 1 parts by weight |
| acrylamide | 8 parts by weight |
| benzoin ethyl ether | 2 parts by weight |
| methyl ethyl ketone | 30 parts by weight |
| toluene | 30 parts by weight |
| meta-denatured alcohol | 30 parts by weight |

A positive original was overlaid on the photosensitive layer of this photosensitive film and the assembly was exposed to light using the machine employed in Example 1 at an exposure figure of 5. After the photosensitive layer had been peeled off, a sharp positive aluminum pattern remained on the substrate.

EXAMPLE 5

A 60 mμ copper film was deposited on one side of a 100μ transparent polyethylene terephthalate film by vacuum evaporation, and the photosensitive solution having the following chemical composition was applied to the surface of this copper film and dried at 90° C. for 5 minutes to obtain a photosensitive film having a thickness of 8μ.

| Photosensitive solution: | |
| --- | --- |
| polyvinyl alcohol (available from Nihon Gosei Kabushiki Kaisha, Tokyo, Japan under the name of "Gohsenol KH-17" | 8 parts by weight |
| bis(acryloxyethyl) phosphate | 3 parts by weight |

-continued

| Photosensitive solution: | |
|---|---|
| benzoin ethyl ether | 0.8 parts by weight |
| meta-denatured alcohol | 128 parts by weight |
| water | 72 parts by weight |

This photosensitive film was exposed to light in the same way as in Example 1. After the photosensitive layer had been peeled off, a sharp positive silver pattern remained on the substrate.

EXAMPLE 6

On one side of a 100μ polyethylene terephthalate film was subjected to sputtering at an output of 0.5 kW using a target of ITO ($In_2O_3$ 95 mol %, $SnO_2$ 5 mol %) to obtain a thin transparent electrically conductive film having a surface resistance of 400 Ω/□. Argon containing 7% of oxygen was employed as a sputtering gas. A photosensitive solution having the following chemical composition was applied to the surface of this thin transparent electrically conductive film and dried at 90° C. for 2 minutes to obtain a photosensitive film having a thickness of 10μ.

| Photosensitive solution: | |
|---|---|
| polyvinyl butyral XYHL | 10 parts by weight |
| bis(acryloxyethyl) phosphate | 0.5 parts by weight |
| pentaerythritol triacrylate | 4 parts by weight |
| 4,4'-bis(diethylamino) benzophenone | 0.2 parts by weight |
| α,α-dichloro-4-phenoxyacetophenone | 0.5 parts by weight |
| meta-denatured alcohol | 70 parts by weight |
| toluene | 20 parts by weight |

This photosensitive film was exposed to light for 40 seconds in the same way as in Example 2. After the photosensitive layer had been peeled off, a positive ITO pattern remained on the substrate.

EXAMPLE 7

A photosensitive solution having the following chemical composition was applied to the surface of the aluminum-evaporated polyethylene terephthalate film used in Example 1 and dried at 90° C. for 2 minutes to obtain a photosensitive film having a thickness of 12μ.

| Photosensitive solution: | |
|---|---|
| linear unsaturated polyester resin (available from Toyo Spinning Co., Ltd., Tokyo, Japan under the name of Bylon-200) | 20 parts by weight |
| acryloxyethyl phosphate | 1 parts by weight |
| benzoin methyl ether | 2 parts by weight |
| P—dimethylamino methyl benzoate | 2 parts by weight |
| methyl ethyl ketone | 40 parts by weight |
| toluene | 40 parts by weight |

This photosensitive film was exposed to light in the same way as in Example 1. After the photosensitive layer had been peeled off, a sharp positive aluminum pattern remained on the substrate.

EXAMPLE 8

A photosensitive solution having the following chemical composition was applied to the surface of the aluminum-evaporated polyethylene terephthalate film used in Example 1 and dried at 90° C. for 2 minutes to obtain a photosensitive film having a thickness of 15μ.

| Photosensitive solution: | |
|---|---|
| vinyl chloride-vinyl acetate-vinyl alcohol copolymer (available from UCC under the name of VAGH) | 20 parts by weight |
| bis(acryloxyethyl) phosphate | 1 parts by weight |
| diacetone acrylamide | 8 parts by weight |
| benzophenone | 1 parts by weight |
| 4,4'-bis(diethylamino) benzophenone | 0.2 parts by weight |
| methyl ethyl ketone | 40 parts by weight |
| toluene | 40 parts by weight |

This photosensitive film was exposed to light in the same way as in Example 2 for 90 seconds. After the photosensitive layer had been peeled off, a sharp positive aluminum pattern remained on the substrate.

EXAMPLE 9

A photosensitive solution having the following chemical composition was applied to the surface of the aluminum-evaporated polyethylene terephthalate film used in Example 1 and dried at 90° C. for 3 minutes to obtain a photosensitive film having a thickness of 10μ.

| Photosensitive solution: | |
|---|---|
| alcohol soluble polyamide (available from BASF under the name of "Ultramide IC") | 20 parts by weight |
| bis(methacryloxyethyl) phosphate | 1 parts by weight |
| benzoin ethyl ether | 1 parts by weight |
| meta-denatured alcohol | 85 parts by weight |
| water | 5 parts by weight | this photosensitive film was exposed to light in the same way as in Example 1. After the photosensitive layer had been peeled off, a sharp positive aluminum pattern remained on the substrate.

EXAMPLE 10

A photosensitive solution having the following chemical composition was applied to the surface of the aluminum-evaporated polyethylene terephthalate film used in Example 1 and dried at 90° C. for 2 minutes to obtain a photosensitive film having a thickness of 7μ.

| Photosensitive solution: | |
|---|---|
| 400 × 110A | 10 parts by weight |
| acryloxyethyl phosphate | 0.5 parts by weight |
| actaethylene glycol diacrylate | 2 parts by weight |
| 2,4-dimethylthioxanthone | 0.5 parts by weight |
| P—dimethylamino isoamyl benzoate | 0.5 parts by weight |
| hydroquinone | 0.1 parts by weight |
| methyl ethyl ketone | 20 parts by weight |
| toluene | 20 parts by weight |

On this photosensitive layer was laminated a 12μ polyethylene terephthalate film (cover film) provided with an acrylic pressure-sensitive adhesive (available from Nippon Carbide Industries Co., Ltd., Tokyo, Japan under the name of "Nissetsu PE115A) in thickness of 25μ to obtain a photosensitive film having a cover film on the photosensitive layer through an adhesive layer.

A positive original was overlaid on the cover film of this photosensitive film and the assembly was exposed to light for 1 minute using a 2 kW ultrahigh-pressure mercury arc lamp at a distance of 1 m. After the photosensitive layer, together with the adhesive layer and the cover film, had been peeled off, a sharp positive aluminum pattern remained on the substrate and a clear negative pattern was formed on the photosensitive layer provided with the adhesive layer and the cover film thereon. With the cover film provided in this way, it was possible to readily peel off the photosensitive layer.

EXAMPLE 11

A photosensitive solution having the following chemical composition was applied to the surface of the polyethylene terephthalate film (temporary substrate) having a thickness of $25\mu$ and dried at 90° C. for 2 minutes to obtain a photosensitive film having a thickness of $8\mu$.

| Photosensitive solution: | |
|---|---|
| phenoxy resin PKHH | 20 parts by weight |
| bis(acryloxyethyl) phosphate | 1 parts by weight |
| trimethylolpropane triacrylate | 8 parts by weight |
| 2,4-diethylthioxanthone | 1 parts by weight |
| benzyl methyl ketal | 1 parts by weight |
| methyl ethyl ketone | 30 parts by weight |
| toluene | 30 parts by weight |
| meta-denatured alcohol | 30 parts by weight |

On this photosensitive layer was laminated at 80° C. a $12\mu$ polyethylene terephthalate film (cover film) coated with a dry laminating adhesive solution having the following chemical composition into a thickness of $3.5\mu$ to obtain a photosensitive layer having a cover film through an adhesive layer.

| Dry laminating adhesive solution: | |
|---|---|
| Polybond NS-1 | 20 parts by weight |
| Polybond CA-1 | 20 parts by weight |
| ethyl acetate | 60 parts by weight |

Then, the $25\mu$ polyethylene terephthalate film was removed and the photosensitive film of the photosensitive layer having the cover film provided thereon through the adhesive layer was laminated at 80° C. on the surface of the aluminum-evaporated polyethylene terephthalate film employed in Example 1 to obtain a photosensitive film.

This photosensitive film was exposed to light for 1 minute in the same may as in Example 10. After the photosensitive layer, together with the adhesive layer and the cover film, had been peeled off, a sharp positive aluminum pattern remained on the substrate and a clear negative pattern was formed on the photosensitive layer provided with the adhesive layer and the cover film.

EXAMPLE 12

A photosensitive layer having a cover film provided thereon through an adhesive layer, which was obtained in the same way as in Example 11, was laminated at 80° C. on the surface of the ITO-sputtered polyethylene terephthalate film used in Example 6 to obtain a photosensitive film.

This photosensitive film was exposed to light for 1 minute in the same way as in Example 10. After the photosensitive layer, together with the adhesive layer and the cover film, had been peeled off, a sharp positive ITO pattern remained on the substrate and a clear negative pattern was formed on the photosensitive layer provided with the adhesive layer and the cover film.

EXAMPLE 13

A 50 m$\mu$ aluminum film was deposited by vacuum evaporation on one side of a polypropylene film which had a thickness of $120\mu$ and which had been subjected to corona discharge surface treatment. The photosensitive solution used in Example 2 was similarly applied to the surface of the aluminum film of this film and dried to obtain a photosensitive film.

This photosensitive film was exposed to light in the same way a in Example 2. After the photosensitive layer had been peeled off, a sharp positive pattern remained on the substrate.

EXAMPLE 14

On one side of a $100\mu$ polyethylene terephthalate film a 50 m$\mu$ copper film was deposited by vacuum evaporated, on top of which a 50 m$\mu$ nickel film was deposited by vacuum evaporation to obtain an image producing layer consisting of two layers made from copper and nickel, respectively.

A photosensitive solution having the following chemical composition was applied to the image producing layer of this film and dried at 90° C. for 2 minutes to obtain a photosensitive film having a thickness of $12\mu$.

| Photosensitive solution: | |
|---|---|
| 400 × 110A | 20 parts by weight |
| bis(methacryloxyethyl) phosphate | 1 parts by weight |
| dipentaerythritol pentaacrylate | 4 parts by weight |
| benzoin ethyl ether | 2 parts by weight |
| P—dimethylamino methyl benzoate | 2 parts by weight |
| hydroquinone | 0.2 parts by weight |
| methyl ethyl ketone | 40 parts by weight |
| toluene | 40 parts by weight |

This photosensitive film was exposed to light for 50 seconds in the same way as in Example 2. After the photosensitive layer had been peeled off, a sharp positive pattern made from two layers of copper and nickel remained on the substrate.

EXAMPLE 15

A 60 m$\mu$ brass (zinc/copper=33/67) film was provided by sputtering on one side of a polyethylene terephthalate film having a thickness of $100\mu$. A photosensitive solution having the following chemical composition was applied to the surface of this brass film of this film and dried at 90° C. for 2 minutes to obtain a photosensitive film having a thickness of $12\mu$.

| Photosensitive solution: | |
|---|---|
| phenoxy resin PKHH | 10 parts by weight |
| bis(acryloxyethyl) phosphate | 0.4 parts by weight |
| acryloxyethyl phosphate | 0.4 parts by weight |
| dipentaerythritol pentaacrylate | 8 parts by weight |
| 4,4'-bis(diethylamino) benzophenone | 0.3 parts by weight |
| $\alpha,\alpha$-dichloro-4-phenoxyacetophenone | 1 parts by weight |
| methyl ethyl ketone | 30 parts by weight |
| toluene | 30 parts by weight |
| meta-denatured alcohol | 30 parts by weight |

This photosensitive film was exposed to light for 1 minute in the same way as in Example 2. After the photosensitive layer had been peeled off, a sharp positive pattern remained on the substrate.

EXAMPLE 16

A photosensitive solution having the following chemical composition was applied to the surface of the aluminum-evaporated polyethylene terephthalate film used in Example 1 and dried at 90° C. for 2 minutes to obtain a photosensitive film having a thickness of 10μ.

| Photosensitive solution: | |
|---|---|
| polyurethane (a 30% solution available from Sanyo Industries Co., Ltd., Tokyo, Japan under the name of "Sanprene LQ-3510") | 100 parts by weight |
| bis(methacryloxyethyl) phosphate | 2 parts by weight |
| benzoin ethyl ether | 1 parts by weight |
| isopropyl alcohol | 100 parts by weight |
| toluene | 100 parts by weight |

This photosensitive film was exposed to light in the same way as in Example 1. After the photosensitive layer had been peeled off, a sharp positive aluminum pattern remained on the substrate.

EXAMPLE 17

A photosensitive solution having the following chemical composition was applied to the surface of the aluminum-evaporated polyethylene terephthalate film used in Example 1 and dried at 90° C. for 2 minutes to obtain a photosensitive film having a thickness of 8μ.

| Photosensitive solution: | |
|---|---|
| polyvinyl butyral XYHL | 12 parts by weight |
| polyvinyl pyrrolidone (available from BASF under the name of "Luriscol K-90") | 2 parts by weight |
| bis(methacryloxyethyl) phosphate | 2.8 parts by weight |
| benzoin methyl ether | 1.4 parts by weight |
| meta-denatured alcohol | 10 parts by weight |
| isopropyl alcohol | 45 parts by weight |
| toluene | 40 parts by weight |

A positive original was overlaid on this photosensitive film and the assembly was exposed to light using the machine employed in Example 1 at a printing exposure figure of 10. After the photosensitive layer had been peeled off, a sharp positive aluminum pattern remained on the substrate.

EXAMPLE 18

A photosensitive solution having the following chemical composition was applied to the surface of a polyethylene terephthalate film (cover film) having a thickness of 12μ and dried at 90° C. for 2 minutes to obtain a photosensitive film having a thickness of 12μ.

| Photosensitive solution: | |
|---|---|
| 400 × 110A | 20 parts by weight |
| acryloxyethyl phosphate | 1 parts by weight |
| diacetone acrylamide | 6 parts by weight |
| benzoin ethyl ether | 2 parts by weight |
| methyl ethyl ketone | 40 parts by weight |
| toluene | 40 parts by weight |

The photosensitive layer of the cover film having this photosensitive layer was laminated at 90° C. on the aluminumevaporated polyethylene film used in Example 1 to obtain a photosensitive film having a cover film.

A positive original was overlaid on the cover film of this photosensitive film and the assembly was exposed to light using the machine employed in Example 1 at a printing exposure figure of 20. After the cover film, together with the photosensitive layer, had been peeled off, a sharp positive aluminum pattern remained on the substrate.

As has been described above, the image producing material according to the present invention enables an image to be produced simply by peeling off the photosensitive layer without the need to apply a special surface treatment to the image producing layer and without the need for any heat treatment or the like after exposure.

What is claimed is:

1. An image producing material which comprises a substrate, an image producing layer and a photosensitive layer in that order and in which, when said material has not yet been exposed to light, the adhesion between said image producing layer and said photosensitive layer is lower than that between said substrate and said image producing layer, whereas, upon exposure to light, the adhesion between said image producing layer and said photosensitive layer becomes higher than that between said substrate and said image producing layer, so that, after exposure, when said photosensitive layer is peeled off, said image producing layer in the exposed area is removed with said photosensitive layer, and said image producing layer in the unexposed area is left on said substrate, said image producing layer being constituted by at least one layer made from a material selected from among a metal, a metal compound and a mixture of a metal and a metal compound, and said photosensitive layer consisting essentially of (A) one or more polymer compound selected from the group consisting of a cellulose ester, a polyamide, a polyester, a polyurethane, a phenoxy resin, a polyvinyl acetal, polyvinyl chloride, a copolymer containing a vinyl chloride component as a constituent element, polyvinyl acetate, a copolymer containing a vinyl acetate component as a constituent element, polyvinylidene chloride, a copolymer containing a polyacrylic ester, a copolymer containing an acrylic ester component as a constituent element, and polyvinyl alcohol, (B) one or more compound of the formula:

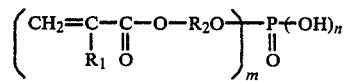

(wherein $R_1$ is hydrogen or a methyl group; $R_2$ is an alkylene group; either one of m and n is 1 or 2 and the other is 2 or 1, i.e., m+n=3), and (C) a photopolymerization initiator.

2. An image producing material according to claim 1, further comprising a cover film provided on said photosensitive layer.

3. An image producing material according to claim 1, further comprising an adhesive layer and a cover film which are provided on said photosensitive layer in that order.

4. An image producing material according to any one of claims 1 to 3, wherein said photosensitive layer contains a polymerizable ethylene unsaturated compound other than compounds of the formula:

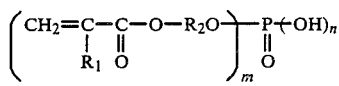

(wherein $R_1$ is hydrogen or a methyl group; $R_2$ is an alkylene group; either one of m and n is 1 or 2 and the other is 2 or 1, i.e., m+n=3).

5. An image producing material according to claim 1, wherein the component (A) of said photosensitive layer is vinyl chloride-vinyl acetate-maleic anhydride copolymer.

6. An image producing material according to claim 1, wherein the component (A) of said photosensitive layer is polyvinyl butyral.

7. An image producing material according to claim 1, wherein the component (A) of said photosensitive layer is a linear unsaturated polyester resin.

8. An image producing material according to claim 1, wherein the component (A) of said photosensitive layer is vinyl chloride-vinyl acetate-vinyl alcohol copolymer.

9. An image producing material according to claim 1, wherein the component (A) of said photosensitive layer is an alcohol soluble polyamide.

10. An image producing material according to claim 1, wherein the component (B) of said photosensitive layer is bis(methacryloxyethyl) phosphate.

11. An image producing material according to claim 1, wherein the component (B) of said photosensitive layer is acryloxyethyl phosphate.

12. An image producing material according to claim 1, wherein the component (B) of said photosensitive layer is methacryloxyethyl phosphate.

13. An image producing material according to claim 1, wherein the component (B) of said photosensitive layer is bis(acryloxyethyl) phosphate.

14. An image producing material according to claim 1, wherein the photopolymerization initiator (C) is benzoin methyl ether.

15. An image producing material according to claim 1, wherein the photopolymerization initiator (C) is 2-chlorothioxanthone.

16. An image producing material according to claim 1, wherein the photopolymerization initiator (C) is benzoin ethyl ether.

17. An image producing material according to claim 1, wherein the photopolymerization initiator (C) is $\alpha,\alpha$-dichloro-4-phenoxyacetophenone.

18. An image producing material according to claim 1, wherein the photopolymerization initiator (C) is 4,4'-bis(diethylamino) benzophenone.

19. An image producing material according to claim 1, wherein the photopolymerization initiator (C) is 2,4-diethylthioxanthone.

* * * * *